(12) United States Patent
Fells

(10) Patent No.: US 10,541,650 B2
(45) Date of Patent: Jan. 21, 2020

(54) HIGH SPEED SAMPLING OF SENSORS

(71) Applicant: Stingray Geophysical Hong Kong Limited, Central (HK)

(72) Inventor: Julian Fells, Horsham (GB)

(73) Assignee: Stingray Geophysical Hong Kong Limited, Central (HK)

( * ) Notice: Subject to any disclaimer, the term of this patent is extended or adjusted under 35 U.S.C. 154(b) by 171 days.

(21) Appl. No.: 15/548,813

(22) PCT Filed: Feb. 5, 2016

(86) PCT No.: PCT/GB2016/050276
§ 371 (c)(1),
(2) Date: Aug. 4, 2017

(87) PCT Pub. No.: WO2016/124946
PCT Pub. Date: Aug. 11, 2016

(65) Prior Publication Data
US 2018/0013387 A1    Jan. 11, 2018

(30) Foreign Application Priority Data
Feb. 5, 2015  (GB) ...................................... 1501888

(51) Int. Cl.
| G01D 5/353 | (2006.01) |
| H03D 3/04 | (2006.01) |
| H03H 17/02 | (2006.01) |
| G01R 23/10 | (2006.01) |
| H03M 1/14 | (2006.01) |
| H03M 1/50 | (2006.01) |
| H03M 1/60 | (2006.01) |

(52) U.S. Cl.
CPC ............... *H03D 3/04* (2013.01); *G01R 23/10* (2013.01); *H03H 17/0266* (2013.01); *H03M 1/14* (2013.01); *H03M 1/502* (2013.01); *H03M 1/60* (2013.01)

(58) Field of Classification Search
CPC .............................. G01D 5/3539; H03D 3/04
USPC .......................................... 356/478; 329/341
See application file for complete search history.

(56) References Cited

U.S. PATENT DOCUMENTS

| 4,799,179 A | 1/1989 | Masson et al. |
| 5,270,666 A | 12/1993 | Rapeli et al. |

(Continued)

FOREIGN PATENT DOCUMENTS

| EP | 1 102 396 A2 | 5/2001 |
| GB | 2414794 A | 7/2005 |

(Continued)

OTHER PUBLICATIONS

European Patent Office, International Search Report issued on PCT application No. GB2016/050276, dated May 3, 2016, 3 pages.

(Continued)

*Primary Examiner* — Joseph Chang
(74) *Attorney, Agent, or Firm* — Greenberg Traurig, LLP

(57) ABSTRACT

Systems and methods for interrogating sensing systems utilising bursts of samples. Bursts of samples correspond to optical pulses returning from optical sensors, where pulses are spaced at a period significantly longer than the pulse width, giving irregular sample spacing. The interrogation system and method processes the irregular busts of samples to recover phase information from received signals.

20 Claims, 18 Drawing Sheets

(56) References Cited

U.S. PATENT DOCUMENTS

2009/0122319 A1\* 5/2009 Ronnekleiv ............ G01H 9/004
  356/477
2013/0292555 A1\* 11/2013 Akkaya ................. G01H 9/004
  250/227.14

FOREIGN PATENT DOCUMENTS

| GB | 2423149 A | 8/2006 |
| WO | 2008/110780 A2 | 9/2008 |
| WO | 2012/061198 A1 | 5/2012 |

OTHER PUBLICATIONS

European Patent Office, Written Opinion issued on PCT application No. GB2016/050276, 6 pages.
Intellectual Propery Office, International Search Report issued on GB1501888.0 application number, dated Aug. 6, 2015, 4 pgs.
European Patent Office, Office Action issued on Application No. 16 704 471.8, dated Jun. 12, 2018, 4 pgs.

\* cited by examiner

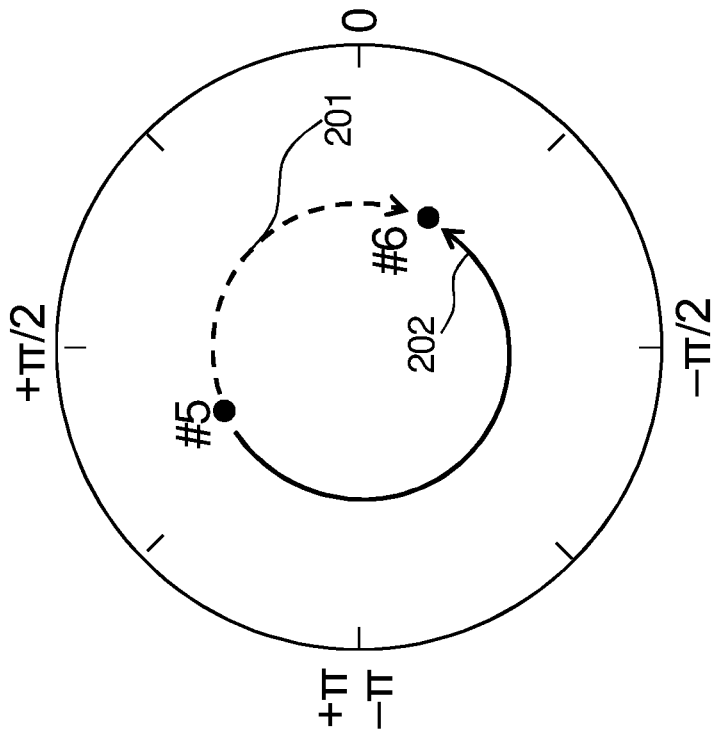
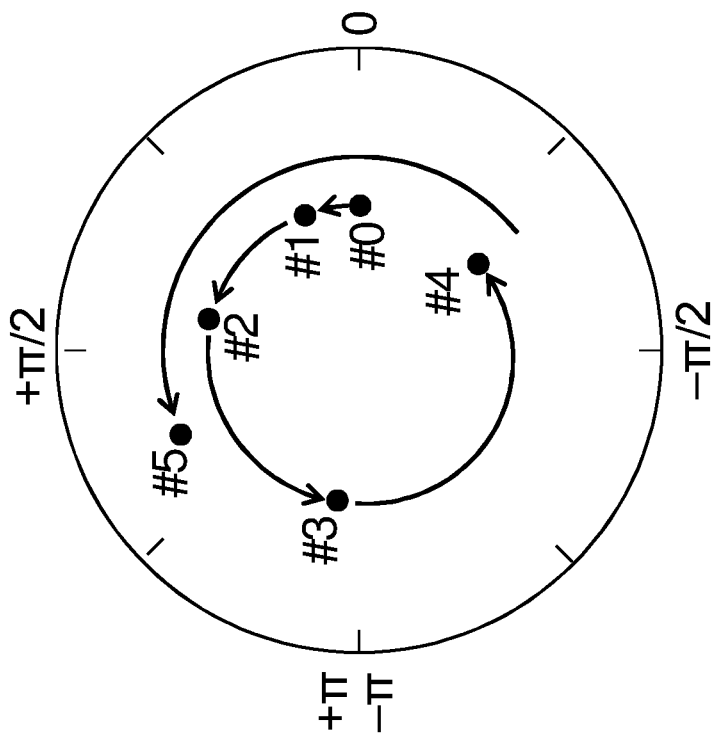
Figure 3b
Figure 3a

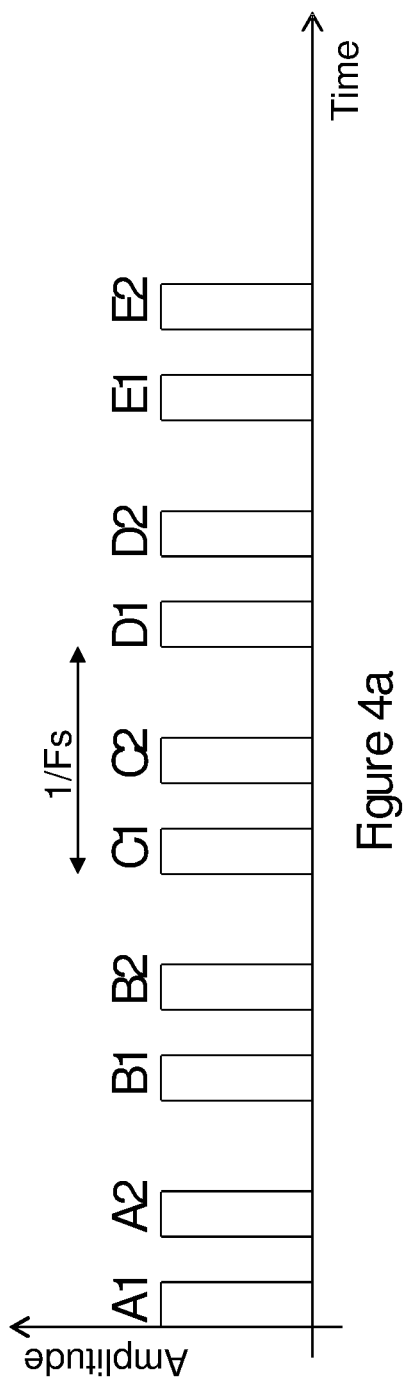
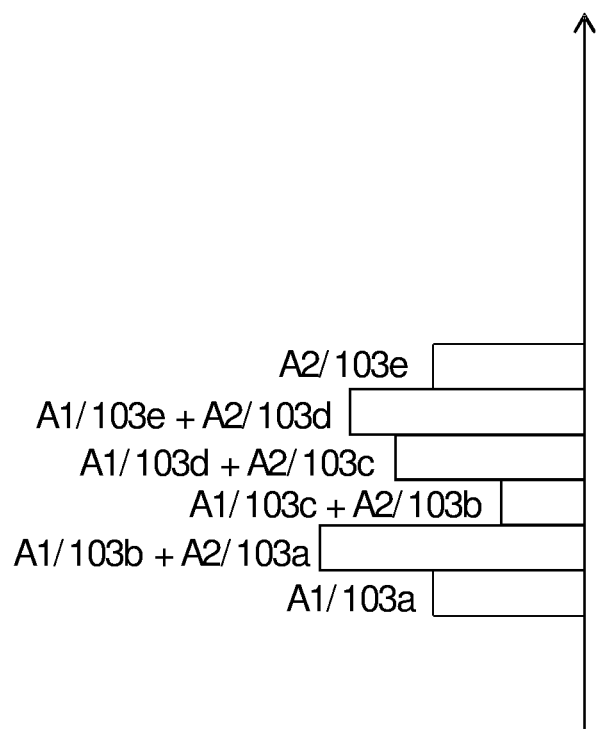

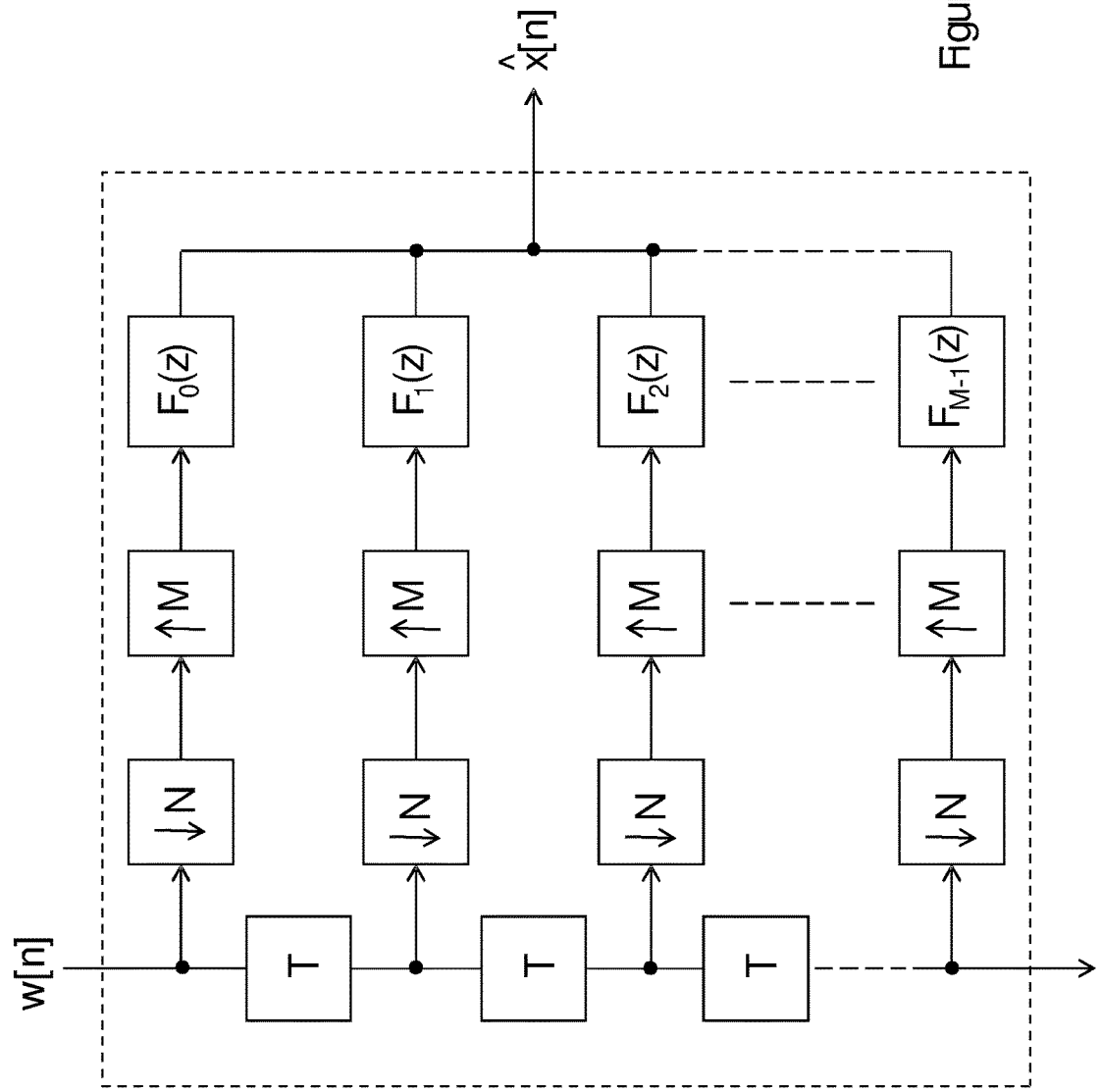

HIGH SPEED SAMPLING OF SENSORS

BACKGROUND

Optical sensors provide a convenient means for remote sensing systems, and enable the monitoring of locations large distances from an interrogation location.

FIG. 1 shows a schematic diagram of an optical sensing system comprising four sensing regions X, Y, Z, P. The optical system comprises a main optical fibre 100 through which light propagates. Each sensing region produces an optical phase change in light propagating through the sensor region in response to a change in the natural phenomena being monitored. For example, a hydrophone may detect changes in pressure or accelerometers may detect a change in velocity. Typically such sensors produce a change in physical length of the optical fibre and hence an optical phase change at the output of the sensor, but other mechanisms may be utilised.

In the system of FIG. 1, optical couplers 101a, 101b, 101c, 101d are provided between each sensor region to couple a portion of the light propagating in the main fibre 100 into a branch fibre 102a, 102b, 102c, 102d. The branch fibres are each terminated by a mirror 103a, 103b, 103c, 103d. A mirror 103e terminates the end of the main optical fibre 100.

An interrogation system 104 comprises at least one light source coupled to transmit light into the main optical fibre 100, and at least one optical receiver coupled to receive light returning from that fibre. The interrogation system may be provided in a distributed manner such that elements are located in different locations. For example, it may be desirable position the optical receiver and sampling systems in proximity to the optical sensors (for example on the sea bed) and to transmit the data to a processing location in a convenient place for analysis.

Light reflected by pairs of mirrors either side of each sensor region interferes at the receiver, with the power of the resulting signal being dependent on the optical phase difference between the returning signals. That phase difference is dependent on the optical phase length of the relevant sensor region, and hence will change depending on that phase length. Changes in the detected power can thus be used to detect changes in sensor phase length and hence the physical phenomena to which the sensor responds.

The output of such optical sensors is cyclical with the optical phase length and thus the change between subsequent samples that can be unambiguously resolved is limited to +/−π radians.

FIG. 2 shows an example of a series of 8 samples from an optical sensing system. FIGS. 3a and 3b show these on a phase circle. At sample #0 the phase is assumed to be 0 as the starting point for the measurement. At samples #1-#3 the phase increases in relatively small increments and can be tracked unambiguously. Between sample #3 and #4 the measured phase "wraps" around from +0.95π to 0.3π (shown by the hollow circle in FIG. 2). However, by making the assumption that the phase never changes by more than π between samples, we can unambiguously resolve the actual total phase change and infer that the phase has continued to increase to +1.7π in relation to the starting phase. Sample #5 shows a measured phase of +0.65π, and by making the above assumption the total phase change can be unambiguously resolved to 2.65π.

Sample #6 shows a sampled phase of −0.18π. Applying the assumption that the phase change is less than π would result in the calculated overall phase change decreasing to +1.82π (point 201). However, in fact, the phase may have continued to increase and has actually increased to +3.82π (point 202). There is therefore an error of 2π in the overall phase change, and the direction of change has been calculated incorrectly. The error between samples 5 and 6 can never be recovered because it is only by continuous tracking that the absolute change can be resolved.

Optical sensors thus have a limited range between samples which limits the rate of change of phase in the output signal that can be detected unambiguously to less than $\pi/T_s$, where $T_s$=sample period. The limit that this applies to the rate of change of the sensed phenomena will depend on the characteristics of the sensor, but the rate is limited.

There is therefore a need for an optical sensing system capable of resolving larger rates of change.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Systems and methods for interrogating sensing systems utilising bursts of samples. Bursts of samples correspond to optical pulses returning from optical sensors, where pulses are spaced at a period significantly longer than the pulse width, giving irregular sample spacing. The interrogation system and method processes the irregular busts of samples to recover phase information from received signals.

There is provided a method of interrogating an optical sensing system performed at an interrogation system, comprising the steps of receiving a plurality of bursts of samples of an optical signal, each burst of samples comprising a plurality of samples of each pulse in a group of discrete optical pulses, wherein the groups are regularly spaced in time with a group repetition period larger than the group width, and the optical pulses comprise a phase modulated signal; processing the bursts of samples to obtain a series of regularly spaced samples; and demodulating the regularly spaced samples to retrieve the phase information from the detected pulses.

The samples may be processed utilising a filter bank.

The filter bank may comprise a number of parallel paths equal to the number of samples in each burst.

The step of processing may comprise the steps of downsampling the received samples, upsampling the downsampled samples, filter the upsampled samples, and combining the filtered samples.

The downsampling ratio may be equal to the sample rate in each burst divided by the group repetition frequency.

The upsampling may be performed at a rate of the group width multiplied by the sample rate in each burst.

There is also provided a method of interrogating an optical sensing system performed at an interrogation system, comprising the steps of receiving a plurality of bursts of samples of an optical signal, each burst of samples comprising a plurality of samples of each pulse in a group of discrete optical pulses, wherein the groups are regularly spaced in time with a group repetition period larger than the group width, and the optical pulses comprise a phase modulated signal; calculating the instantaneous frequency of the signal represented by each burst of samples; and recovering phase information of the detected pulses.

The step of calculating may comprise filtering the samples utilising an FIR filter having a length less than the number of samples in each burst of samples.

There is also provided a method of interrogating an optical sensing system performed at an interrogation system, comprising the steps of receiving a plurality of bursts of samples of an optical signal, each burst of samples comprising a plurality of samples of each pulse in a group of discrete optical pulses, wherein the groups are regularly spaced in time with a group repetition period larger than the group width, and the optical pulses comprise a phase modulated signal; phase locking a signal to the samples of each burst of samples; and utilise the phase locked signal to recover phase information of the detected pulses.

Each group of pulses may consist of a single pulse.

Each burst of samples may comprise 8 to 80 samples.

The samples within each burst may be at a sampling frequency of 40 to 400 MHz.

The group width may be 200 ns.

The group repetition period may be in the range of 0.5 µs to 10 µs.

The regularly spaced samples may have a sample rate in the range of 10 MHz to 20 MHz.

The method may further comprise the steps of detecting the optical pulses, and sampling the pulses to obtain the bursts of samples, and transmitting the bursts of samples to the interrogation system.

The steps of detecting, sampling, and transmitting may be performed at a different location to the other steps of the method.

The optical pulses may be returning from an optical sensor.

The method may further comprise the steps of detecting other optical pulses returning from other optical sensors, wherein the optical pulses returning from different sensors are time multiplexed.

The phase change between adjacent samples of the regularly spaced samples may be less than π.

There is also provided an interrogation system configured to perform the methods described herein.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which:—

FIGS. 3a and 3b show phase plots relating to FIG. 2;

FIG. 4a shows an example of pulses transmitted into a system to interrogate the sensors;

FIG. 4b shows an example of pulses returning from a sensor of the system of FIG. 1;

FIG. 11a shows a filter bank for processing irregular samples;

FIG. 12 shows a filter bank for designing the filters utilised in the filter bank of FIG. 11a;

Figure 1:
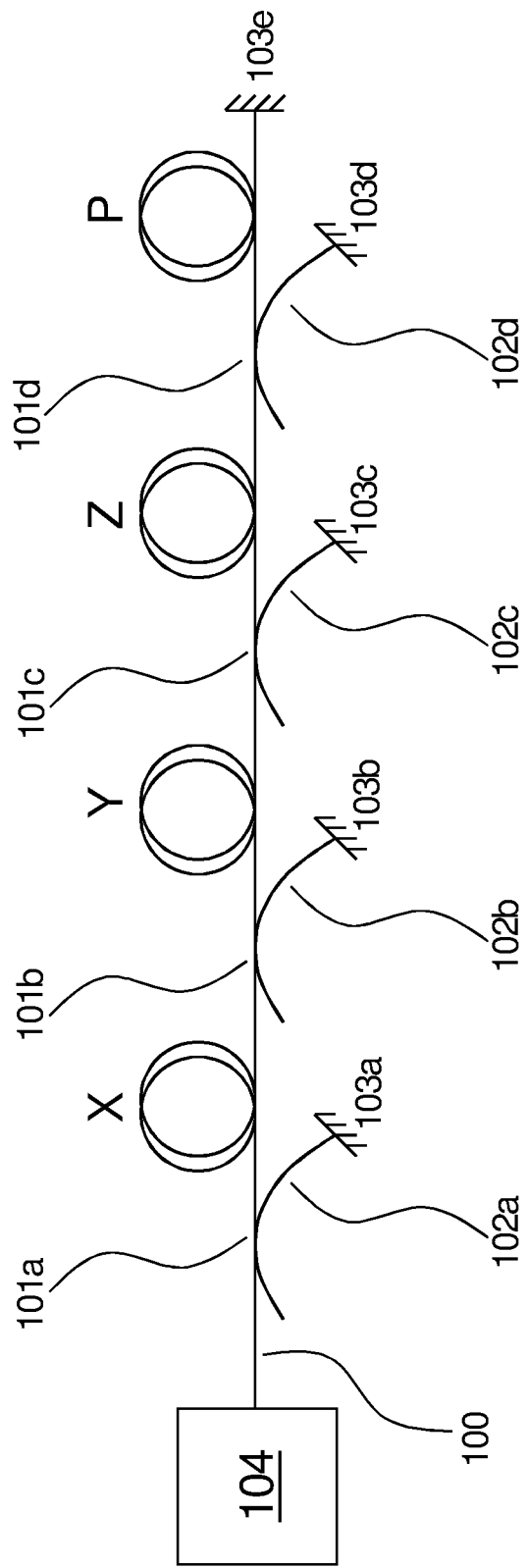
FIG. 1 shows a schematic diagram of an optical sensing system.
Figure 2:
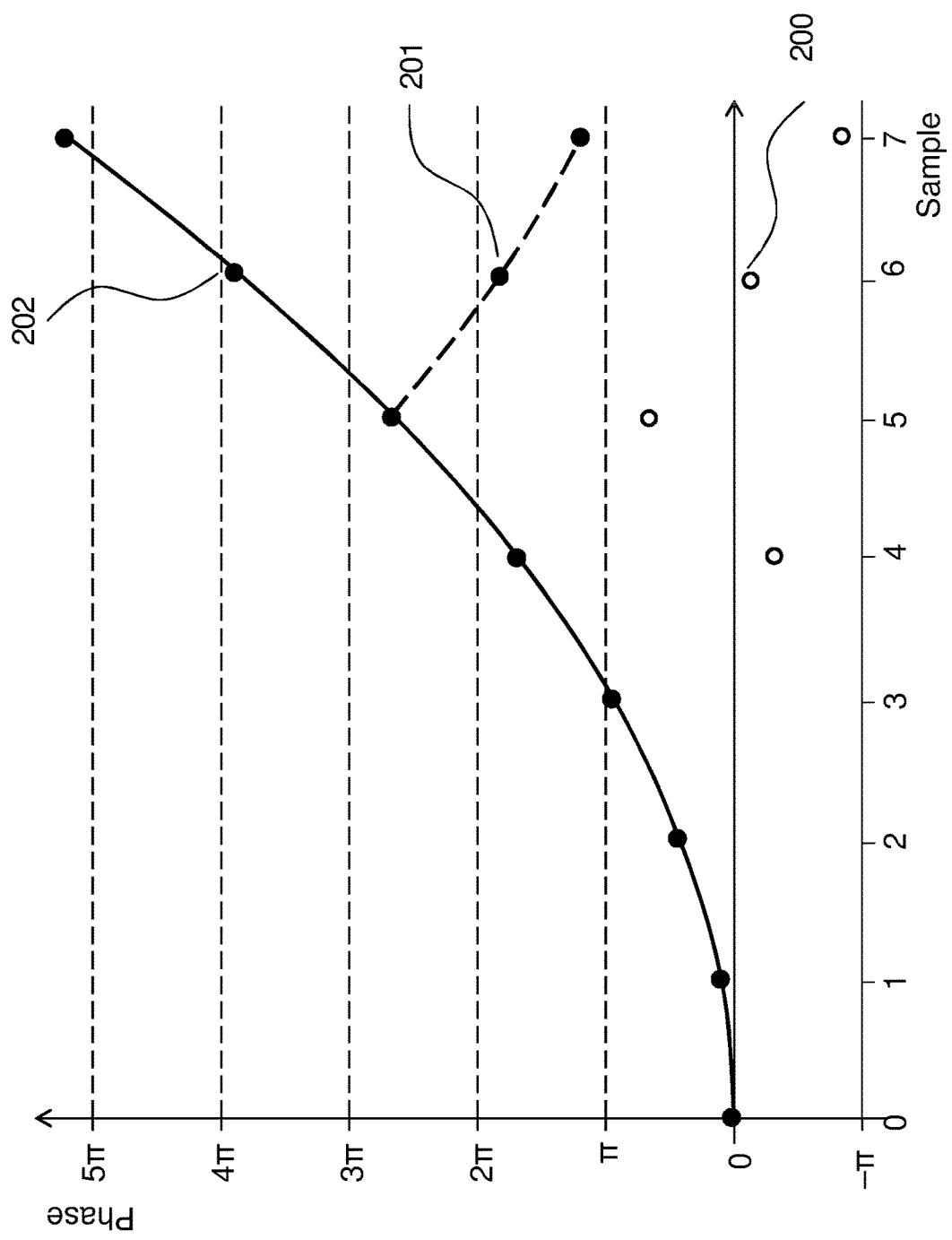
FIG. 2 shows an example output of an optical sensor.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

FIG. 4a shows a series of optical pulses which may be used to interrogate the optical sensor system of FIG. 1. Each pair of pulses is timed such that a reflection of the first pulse from the second of a pair of mirrors interferes with a reflection of the second pulse of the pair from the first of that pair of mirrors at the interrogation system. That is, a reflection of pulse A1 from mirror 103b returns to the interrogation system at the same time as a reflection of pulse A2 from mirror 103a. The delay between pulses A1 and A2 is thus equal to the difference in round-trip time from the interrogator to mirrors 103a and 103b, 103b and 103c, 103c and 103d, 103d and 103e. A single overlapping pulse is thus received at the receiver for each sensor region X, Y, Z, and P. As the optical phase length of the sensor regions changes the result of the interference between A1 and A2 changes, which can be used as explained above to determine changes in the physical phenomena detected by the sensors.

Subsequent pairs of pulses B1, B2 etc can be transmitted into the fibre after an appropriate delay such that the final useful reflection from the first pair of pulses has returned to the interrogation system before the first useful reflection of the second pair of pulses. The delay between pairs of pulses defines the optical sampling period $T_s$ ($T_s=1/F_s$, where $F_s$ is the optical sampling frequency) for each sensor region.

Sensors X, Y, Z, and P are located sequentially along the main fibre 100 and accordingly can be interrogated using a single pair of pulses, with reflected pulses being time-multiplexed in the returning signals. FIG. 4b shows the return signal from a single pair of pulses (e.g. A1 and A2) being launched into the sensor system. The first return pulse is the reflection of pulse A1 from mirror 103a, and the last pulse is a reflection of pulse A2 from mirror 103e. The central pulses are pairs of overlapping pulses reflected from the pairs of mirrors 103a/103b, 103b/103c, 103c/103d, and 103d/103e. Each of these central pulses contains information on the optical phase length of the sensors X, Y, Z, and P.

In a typical system the pulse width, $W_p$, may be 200 ns, with a spacing of 200 ns between pulses of a pair. The spacing between pairs of pulses varies strongly depending on the length (and hence round-trip time) of each system. In FIG. 4a this is 1 µs which is sufficient for the 4 sensors.

The pairs of pulses may be at different optical frequencies in a heterodyne system, or the same frequency in a homodyne system. In general a heterodyne system is preferred to avoid difficulties with zero signals in a homodyne arrangement. The following description will concentrate on a heterodyne system, but the principles are also applicable to homodyne systems.

Figure 5:
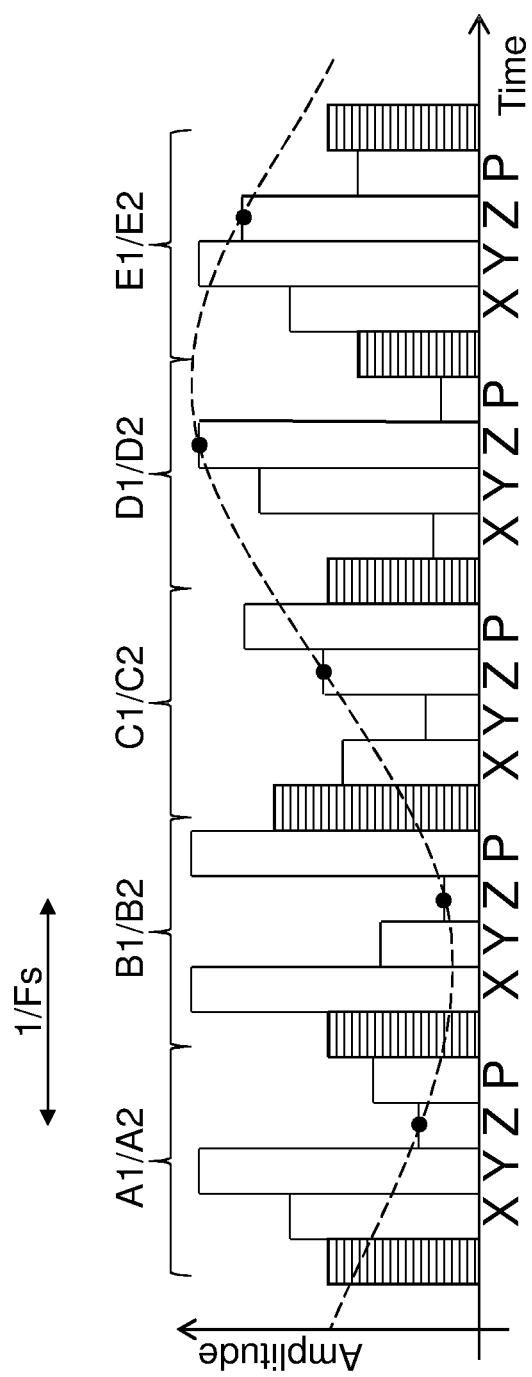
FIG. 5 shows an example of pulses returning from the system of FIG. 1.

FIG. 5 shows an example of the signals received from transmitting the signals shown in FIG. 3 into the system of FIG. 1. Each bar represents a returning pulse from the system. The hatched bars represent non-useful single-pulse reflections (e.g. A1/B1/C1/D1/E1 from mirror 103a and A2/B2/C2/D2/E2 from mirror 103e), as described above with reference to FIG. 4. In FIG. 5, the timing is such that the final non-useful pulse from one pulse pair coincides with the first non-useful pulse from the subsequent pulse pair (e.g. A2/103e coincides with B1/103a etc.). This minimises the percentage of unusable time.

The dashed line shows the signal interpolated between the signals returning from sensor Z. The signal has the form $\sin(2\pi(f_2-f_1)t+\phi_z(t))$, where $f_2$ is the optical frequency of the second pulse in each pair (A2, B2, C2 etc.) and $f_1$ is the optical frequency of the first pulse in each pair (A1, B1, C1 etc.), and $\phi_z(t)$ is the optical phase shift of sensor z with time, t. The resulting signal is thus a phase-modulated sine wave with a carrier frequency $F_c=(f_2-f_1)$. The detected pulses represent samples along that signal, with an optical sampling period of $1/F_s$ defined by the spacing between pairs of pulses, as described with reference to FIG. 3.

It is attractive to increase the number of sensors which are time-multiplexed. A dense system may therefore instead have a pulse-pair spacing of 5 µs (giving an optical sample period of $T_s=5$ µs and an optical sample frequency of $F_s=200$ kHz). Such a dense system would allow 4 sensor units similar to that of FIG. 1 and an additional single reference sensor to be interrogated by appropriately multiplexing them with delays to give 17 sensors in total.

In accordance with the Nyquist sampling theorem, samples at a sampling frequency of $F_s$ can only unambiguously recover signals in a bandwidth of $F_s/2$, if there are no other constraints on the signal. The rate of change of $\phi_z(t)$ must thus be limited such that the total bandwidth of $\sin(2\pi(f_2-f_1)t+\phi_z(t))$ is less than $F_s/2$. That is:—

$$F_c+(-\tfrac{1}{2}\pi)d\phi/dt<F_s/2.$$

This is equivalent to the explanation above of a limit of a π radian phase change between samples. The instantaneous frequency is defined $$F_i=F_c+(-\tfrac{1}{2}\pi)d\phi/dt.$$

Figure 6:
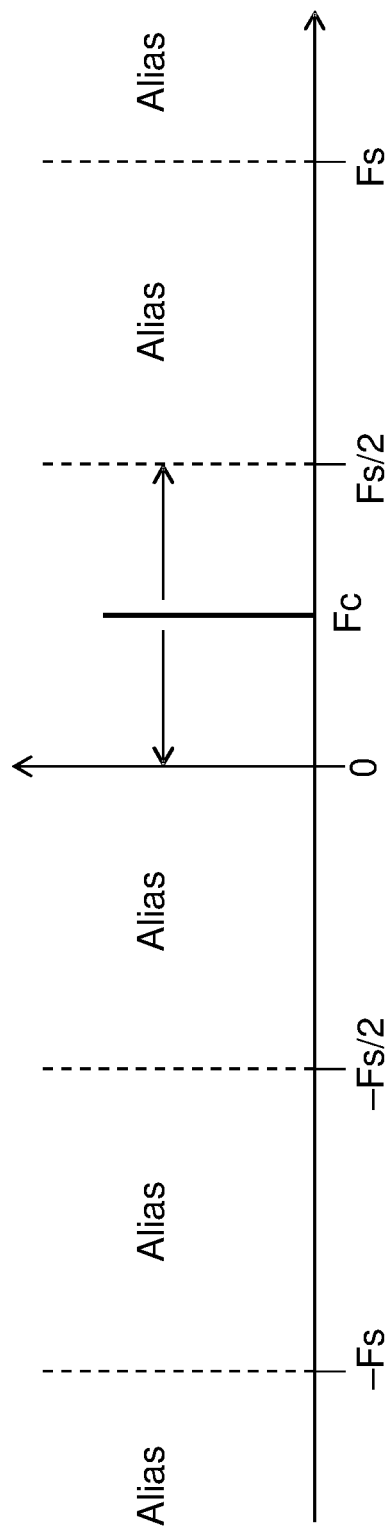
FIG. 6 shows a frequency chart.

FIG. 6 shows the frequency domain with the carrier signal $F_c$ positioned at $F_s/4$, which provides the maximum use of the $0-F_s/2$ bandwidth having equal bandwidths of $F_s/4$ for positive and negative frequency shifts. Beyond $+/-F_s/4$ (0 to $F_s/2$) aliasing occurs and the original signal cannot be unambiguously recreated. In the example of FIG. 5, $F_s$ is 1 MHz, but for a dense system a typical $F_s$ may be 200 kHz, giving a bandwidth of +/-50 kHz.

The impact of this is that the carrier frequency $F_c=f_2-f_1$ and rate of change of $\phi_z$ is limited by the optical sampling rate. In turn the upper limit of the optical sampling rate is limited by the period required between pairs of pulses which is set by the optical length of the system to avoid overlap between signal returning from the first and last sensors. For a given system there is therefore a maximum achievable pulse repetition rate, which gives a maximum sample rate, which in turns defines the maximum achievable bandwidth of each sensor.

Figure 7:
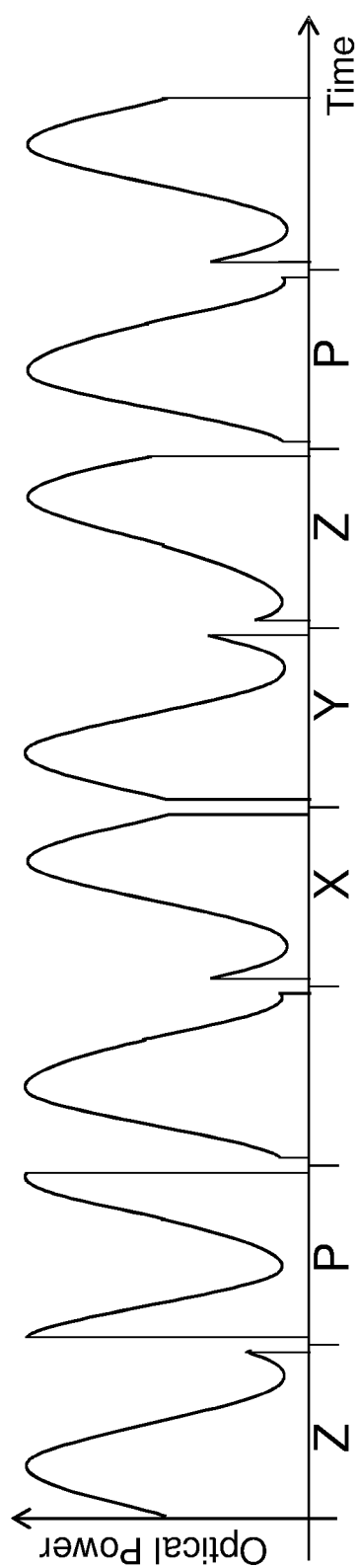
FIG. 7 shows a series of returning pulses from a sensor system.

FIG. 7 shows optical power received at the interrogation unit in a system of FIG. 1 in which the instantaneous frequency, $F_i$, is much larger than discussed above. Due to the higher instantaneous frequency the optical power varies significantly within the period of the returning pulse. FIG. 7 shows an optical signal with an instantaneous frequency of 4 MHz. Hence $1/F_i$ is only slightly longer than the pulse width (a 250 ns cycle against the 200 ns pulse). In an example, $F_c$ may be defined as 3 MHz, which has a cycle of 333 ns. Under static conditions, $F_i=F_c$, so a 200 ns pulse would contain around 60% of one cycle. Negative phase ramps will result in an increase in $F_i$ (e.g. up to close to 6 MHz) and positive phase ramps will result in a decrease in $F_i$ (e.g. down to close to 0 Hz). When a phase change is applied to that signal the instantaneous frequency may increase to 4 MHz as shown in FIG. 7. In example systems the unmodulated carrier frequency, $F_c$, may be such that each optical pulse may contain >50% of a cycle or >a whole cycle.

In the conventional sampling system described above there would be a single digital sample for each optical pulse such that the digital sample rate matches the optical sample rate; the digital sampling rate would not be high enough to recover the signal and information would be lost.

Figure 8:
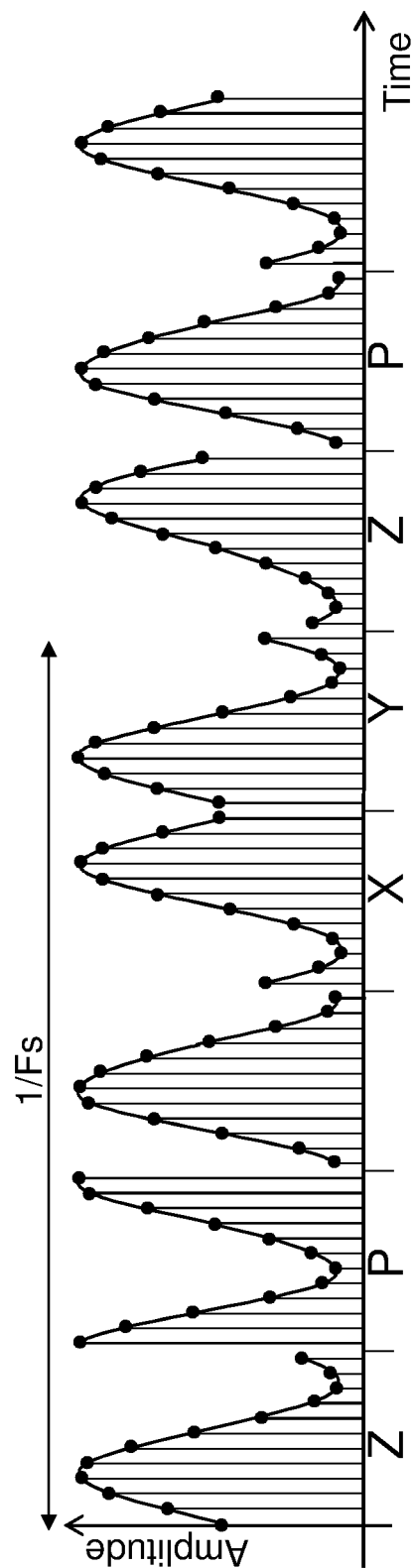
FIG. 8 shows the pulses of FIG. 7 sampled at a high rate.

FIG. 8 shows the signal of FIG. 7 digitally sampled with an analogue to digital converter at a higher rate than in previous systems.

Figure 9:
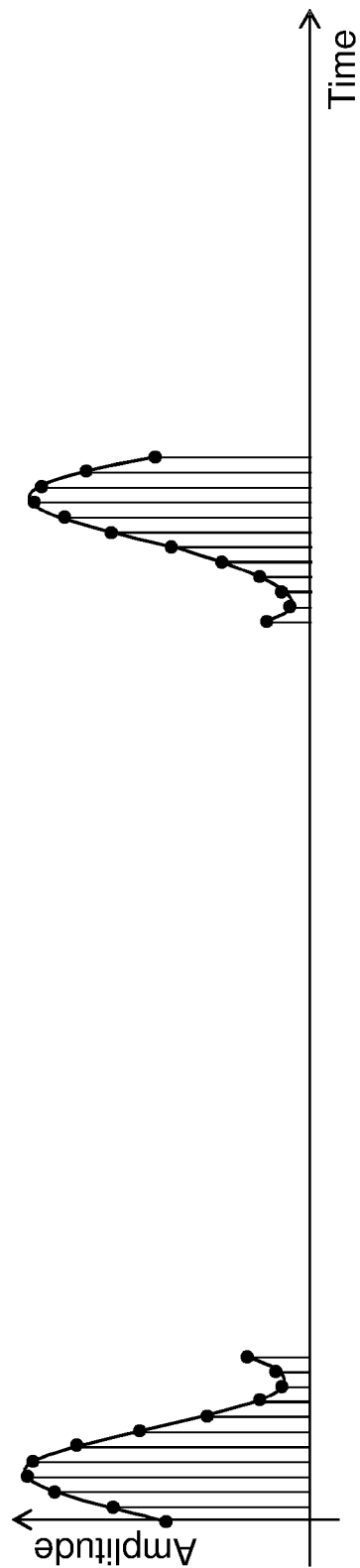
FIG. 9 shows a single sensor's pulses from FIG. 8.
Figure 10:
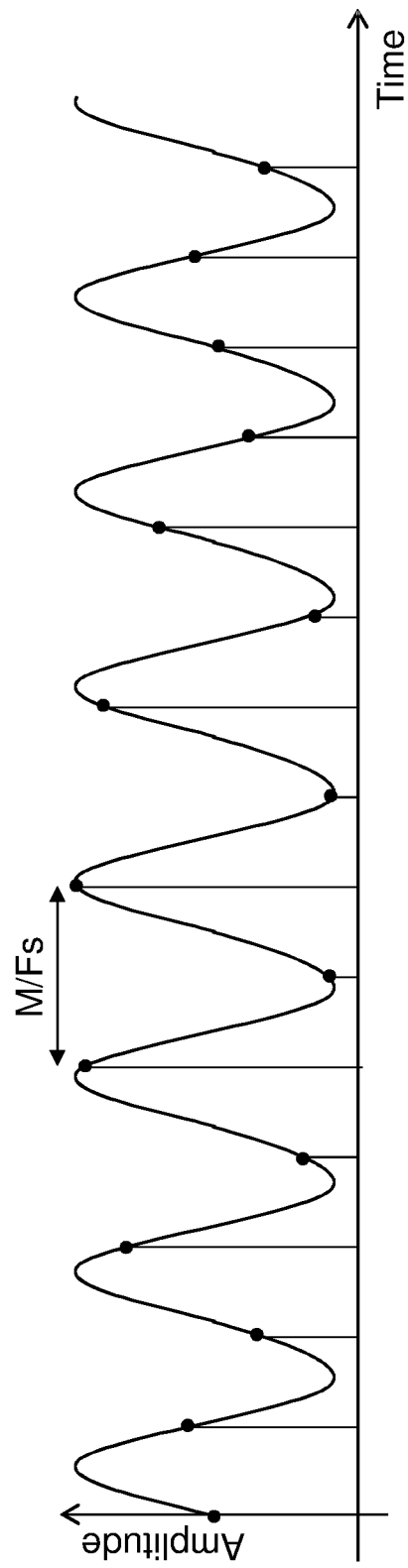
FIG. 10 shows a reconstructed signal.

FIG. 9 shows the sampled signals of FIG. 8 for only a single sensor. As shown in this figure the digitally sampled data comprises discontinuous bursts of samples, with significant periods with no information on the signals. In this example system the pulse width $W_p=200$ ns with a pulse repetition period of 1 µs. In the example shown, a digital sample rate $F_d=60$ MHz provides 12 samples within each pulse. There are thus M=12 samples unevenly distributed over a period of 1 µs. Conventional sampling and processing systems utilise regular sample spacing to recover the input signal. However, special processing techniques may be utilised to recover the signal from this form of data. Processing the discontinuous samples of FIG. 9, as described below, yields a set of regularly spaced samples at a rate equivalent to the average sample rate of FIG. 9, as shown in FIG. 10. These samples can then be utilised to unambiguously recover the signal, provided the criteria discussed below are met. The effective sampling rate of this technique is much higher than in the conventional system described above and accordingly the sensor's bandwidth is improved.

The signal of FIG. 10 is $\sin(2\pi(f_2-f_1)t+\phi_z(t))$ and thus the sensor's phase change can be extracted by demodulating the signal. The average sampling frequency is given by $$F_{av}=M \cdot F_s=W_p \cdot F_d \cdot F_s$$

In the example discussed above 12 samples are obtained every 1 µs, giving an average sample rate in FIG. 10 of $F_{av}=12$ MHz. The Nyquist theorem applies to the average sampling rate, and therefore the bandwidth for perfect reconstruction is 0-6 MHz.

As above, selecting the centre of the bandwidth as the carrier frequency, $F_c$, maximises the bandwidth available for phase changes, and thus $F_c$ may be selected as 3 MHz, giving a bandwidth of +/-3 MHz for phase change measurements.

As previously described it is desirable to increase the multiplexing to allow a dense system of 17 sensors by increasing the optical sample period to 5 µs. This may be achieved by increasing the digital sample rate to $F_d$=300 MHz so that there are 60 pulses within each returned signal. With a 5 μs optical sample period and 200 ns pulse width, this corresponds to an average sampling rate of $F_{av}$=12 MHz as before. Thus the same carrier frequency of $F_c$=3 MHz can be used allowing a range of +/−3 MHz as before. This compares favourably with a bandwidth of +/−50 kHz in previous dense systems.

In certain circumstances it may be possible to reduce the sample rate by making assumptions about the input signal. For example, it may be possible to assume that the input signal has the form $\sin(2\pi(f_2-f_1)t+\phi_z(t))$, with the amplitude and frequency of ϕ assumed to be limited to known ranges.

Various methods are known for converting a discontinuous set of samples into regularly spaced samples. Recovery of the original signal then requires conventional processing. FIG. 11 shows a schematic diagram of a reconstruction system utilising a filter bank to convert the set of discontinuous samples w[n] into a regular set of samples x^[n]. Delay elements 'T' provide a delay equal to the input digital sample period, $1/F_d$, such that each path of the filter bank starts processing from a different sample. The number of paths in the bank is equal to the number of samples in each burst. The signal of each path is first downsampled (by $N=F_d/F_s$) to select one sample from each burst. Due to the delay elements T each path processes a different sample of the bursts, such that all samples are processed by one path. The signals are then upsampled (by $M=W_p \cdot F_d$) to the average sampling rate, $F_{av}$, to produce a regular set of samples. The regular samples are then filtered by a respective filter $F_0(z) \ldots F_{M-1}(z)$ and the paths are combined to provide a regular set of samples representing the signal of one sensor, which can be processed to obtain the phase data for that sensor. As explained above the bandwidth is significantly increased compared to previous sensors and hence the sensor system bandwidth is also increased.

In summary, a series of bursts of samples are obtained, each burst corresponding to one of a series of detected, regularly spaced, optical pulses. The bursts of samples are converted to a regular series of samples which may then be demodulated to retrieve a signal with which the detected pulses were modulated.

Figure 11B:
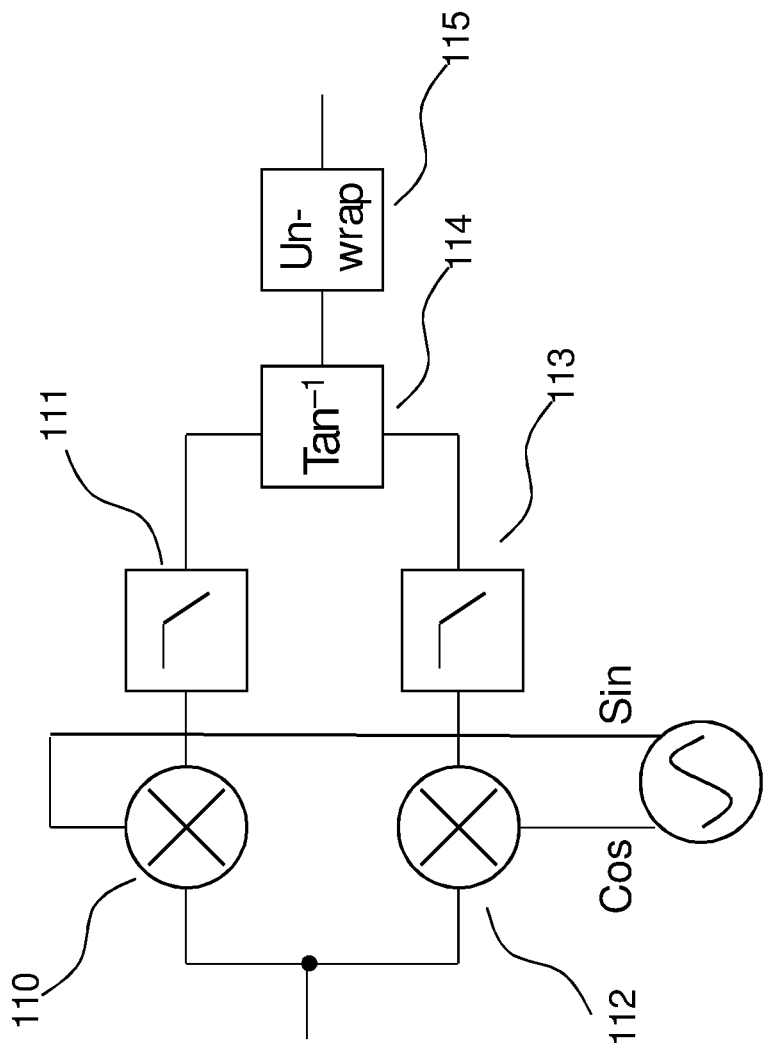
FIG. 11b shows an example phase demodulation apparatus.
Figure 12:
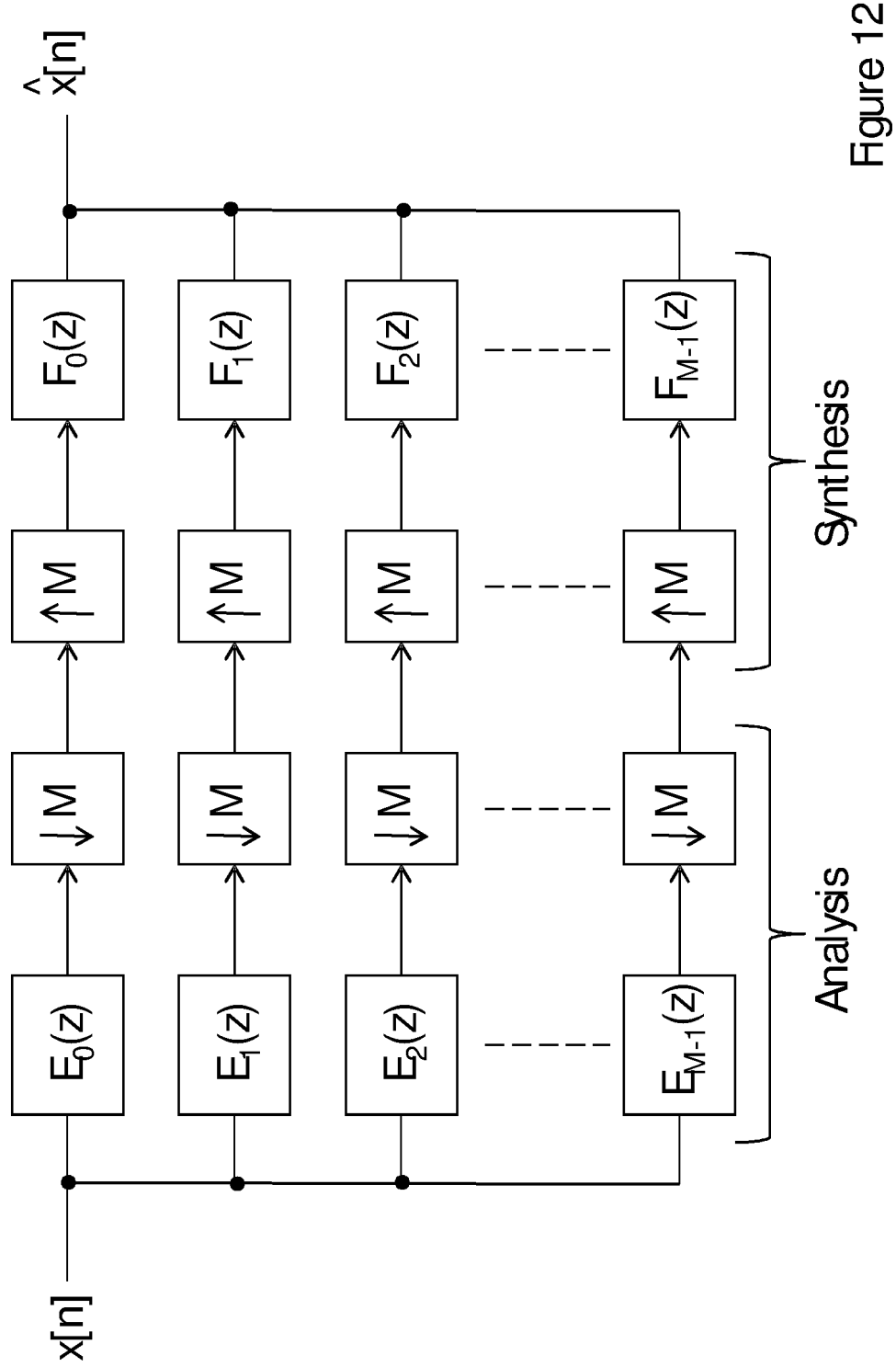

There are a number of conventional techniques which can be applied to demodulate the phase once it has been transformed to a uniform sampling pattern. One technique, shown in FIG. 11b, is to split the signal into two and generate inphase I and quadrature Q signals. The I signal may be generated by multiplying (110) by $\sin(2\pi F_c t)$ and low pass filtering (111) to remove components of $2F_c$ and above. Similarly the Q signal may be generated by multiplying (112) by $\cos(2\pi F_c t)$ and low pass filtering (113). In an example $F_c$ is locked to the oscillator that generates $F_1$ and $F_2$ for example, the same oscillator is utilised. The phase is then demodulated using a four quadrant arc tangent function (114) as $\phi_z(t)=\arctan(Q/I)$. The demodulated phase is then unwrapped (115). However other phase demodulation schemes (e.g. Hilbert Transformer, phase-locked loop) are equally applicable. Once the phase has been demodulated and unwrapped it can be decimated to the required output sample rate. It can be converted to the correct units by multiplying by an appropriate calibration coefficient. The paper *Multirate Filter Bank Reconstruction of Signals from Bunched samples, Conference record of the Thirty-Sixth Asilomar Conference on Signals, Systems and Computers*, 2002, Volume 1, Pages 781-785, provides a method of calculating the filter coefficients $F_0(z) \ldots F_{M-1}(z)$ in FIG. 11 for near-perfect reconstruction of signals and is incorporated herein in its entirety. Briefly, the input w[n] is modelled by an interpolator which consists of the cascade of an upsample by P operation followed by interpolation filter $H_{int}(z)$, where P=M/N. The interpolation filter is chosen to have a normalised cut-off of Tr/2 rad. It is chosen as a compromise, such that it has sufficient order to give a reasonable approximation to x[n] where x[n] is the true input signal at sample rate $F_{av}$. However, the order should be minimised to reduce the complexity of the resulting synthesis filters. The interpolation filter, $H_{int}(z)$, is then transformed to be in polyphase form in terms of $z^P$. The Noble Identity is then used, to swap the cascade order, such that the polyphase interpolation filter (now in terms of z) precedes the downsample by P operation. Once this has been done, the downsample by P is combined with downsample by N, to yield a single downsample by M. The transformed interpolation filter coefficients are combined with the delay terms to generate filters $F_0(z) \ldots F_{M-1}(z)$. These transformations result in the maximally decimated filter bank shown in FIG. 12. This filter bank takes the actual input signal x[n], hypothetically sampled at rate $F_{av}$, and generates the approximated signal x^[n] sampled at $F_{av}$. Near perfect reconstruction of the whole system is achieved if $$\hat{x}[n]=K \cdot x[n-d]$$

where K is a constant scaling factor and d is a delay. A matrix approach is then used to solve this equation for the maximally decimated filter bank of FIG. 12, to determine the filters $F_0(z) \ldots F_{M-1}(z)$. These filters can then be used for the implementation of the system of FIG. 11. A more general technique can be found in *Reconstruction of Bandlimited Periodic Nonuniformly Sampled Signals through Multirate Filter Banks, IEEE Transactions on Circuits and Systems I: Regular Papers*, Volume 51, Issue 8, Prendergast, R. S., and is incorporated herein in its entirety; further techniques are disclosed in references [7], [8] and [9] of this work. Using this more general technique it is possible to cover situations whereby the samples are more complicated than a periodic bunched pattern. For example, rather than have a simple pair of pulses, each pulse within the pair could themselves be divided up. One configuration would be to have the pulse at $f_1$ separated into a pulse 100 ns long, followed by a 100 ns gap, followed by a 100 ns long pulse. Similarly the pulse at $f_2$ is separated into a pulse 100 ns long, followed by a 100 ns gap, followed by a 100 ns long pulse. Now every sample period, $T_s$ there are two bunches of samples rather than a single bunch. E.g. for $f_d$=300 MHz, there will be 30 samples, followed by a 100 ns gap followed by another 30 samples, then a gap of 4700 ns and then repeating. Within the gaps another string of sensors could be inserted, by appropriately multiplexing them in with delays.

The pulse signals transmitted into the system may be generated in any conventional manner. For example, a known approach is to use an Acousto-Optic Modulator (AOM) which modulates both amplitude and frequency of light. When the AOM is "on" to allow light to pass the output optical frequency is shifted by the RF frequency used to drive the modulator. By varying that frequency different frequency shifts can be applied. For example, the two pulses used in the examples may be generated using an AOM driven at 198.5 MHz for the first pulse and 201.5 MHz for the second pulse. As will be appreciated by the reader, the above description has been given in relation to a limited number of sensors, but the concepts described can be expanded to apply to any number of multiplexed sensors and light sources. For example, it is known to utilise an interrogator system to generate multiple wavelength signals, with different wavelengths being directed to different sensors by wavelength selective couplers in the sensor system. Similarly the receiver system at the interrogator utilises known techniques and configurations, but with a higher sampling frequency to allow the processing described above.

Figure 13:
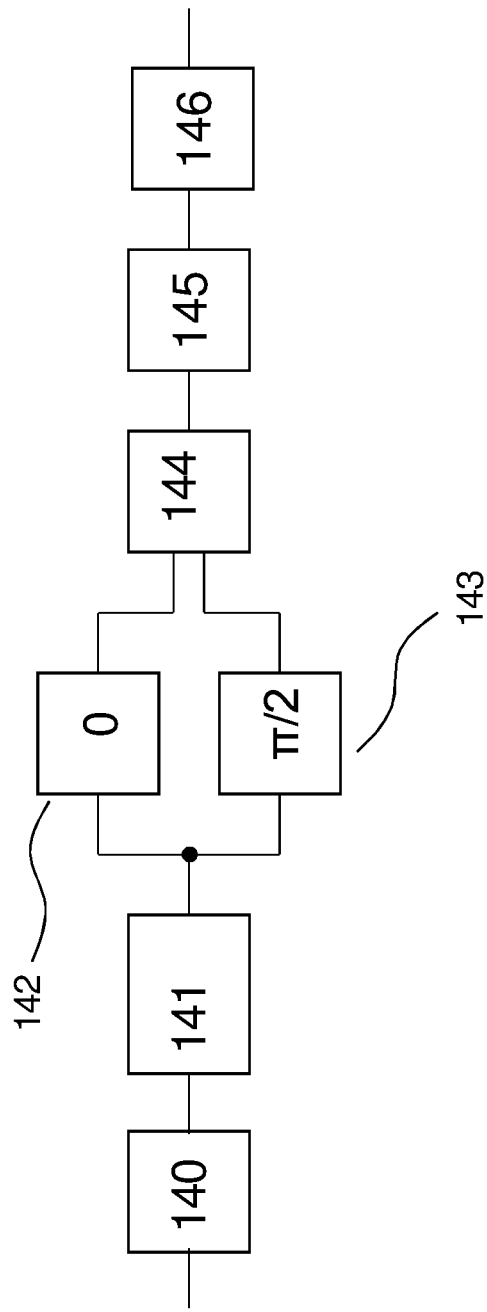
FIG. 13 shows a system of processing data utilising instantaneous frequency.
Figure 14:
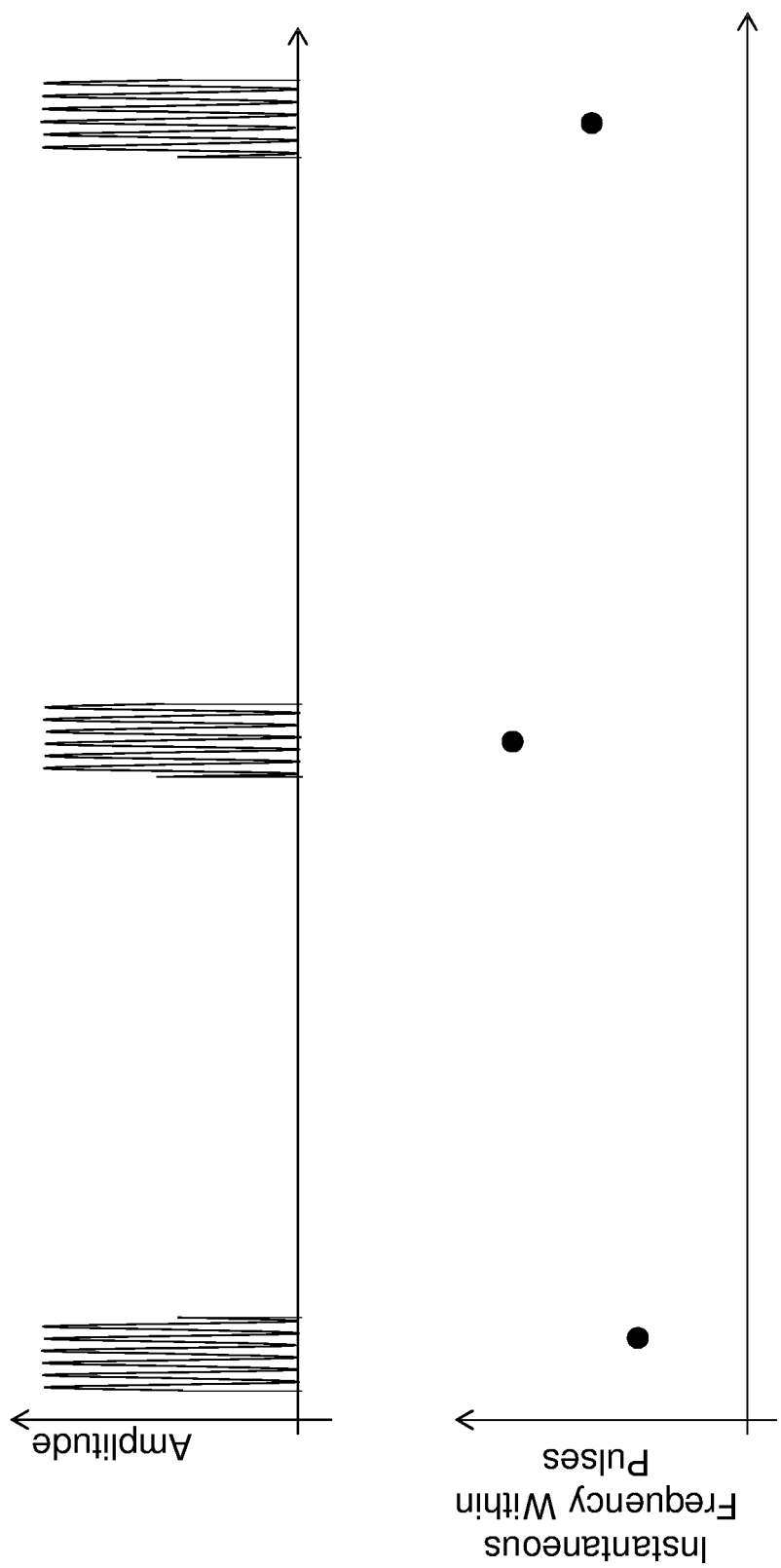
FIG. 14 shows a chart of instantaneous frequency.

In alternative systems the discontinuous signal may be processed in other ways to recover the signal. FIG. 13 shows a system for determining the instantaneous frequency, and calculating a phase value. FIG. 14 shows the amplitude of the signal and its instantaneous frequency. The signal at the interrogation system comprises bursts of high frequency carrier signal, phase modulated by the optical sensor regions. The instantaneous frequency of each signal burst contains information on the optical phase change during that burst and can be utilised to recover the phase signal. The signal is sampled at block 140 at a high digital sampling frequency, $F_d$ (e.g. $F_d$=300 MHz) and a set of M samples for each pulse gathered in buffer 141. The samples are passed through a Matched FIR filter 142 to give the real part and a Hilbert FIR filter 143 to give the imaginary part, each filter having a length less than M. The filters 142 and 143 are designed so that they have substantially the same spectral amplitude response, but with filter 143 having a $-\pi/2$ phase difference across the passband. The outputs of these filters are used to calculate the instantaneous frequency, $F_i$, at block 144:—

$$F_i = \frac{F_d}{2\pi} \text{Arg} \sum_{n=1}^{M-1} z_{n+1} z_n^*$$

Where * denotes the complex conjugate, $Z_n$ and $Z_{n+1}$ are consecutive complex samples arising out of the Hilbert FIR filter/matched filter combination, and Arg is the angle of the resulting complex number. The signal is low-pass filtered at block 145. It is then integrated at block 146 to recover the phase using $$\theta = -2\pi \int F_i dt$$

Other processing operations may be performed such as decimation and multiplication by sensor calibration coefficients.

Figure 15:
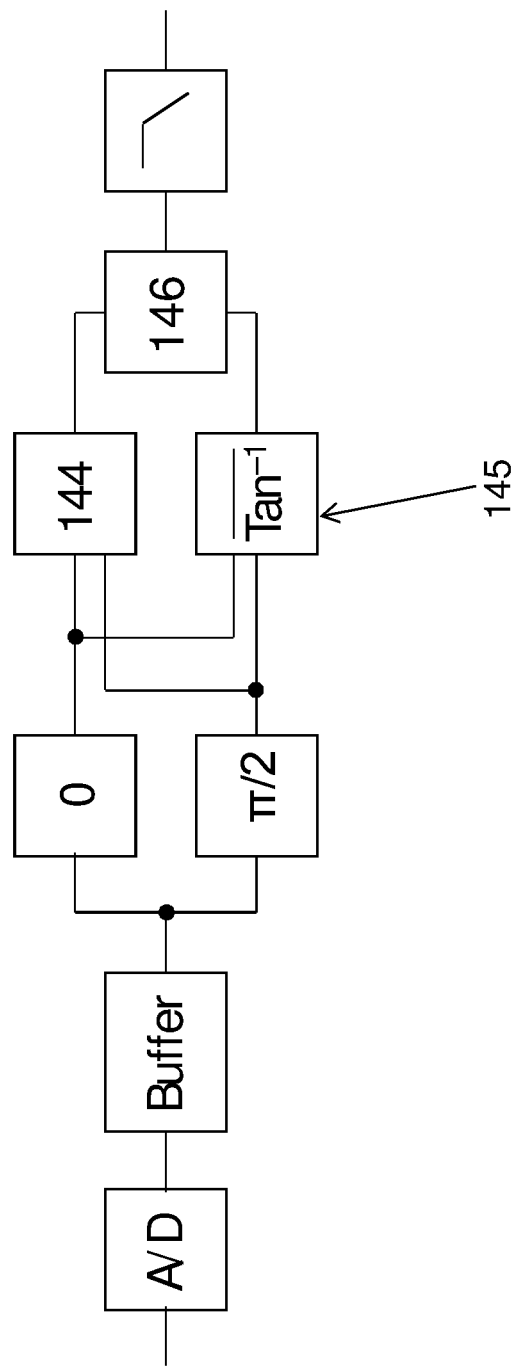
FIG. 15 shows a further system utilising instantaneous frequency.
Figure 16:
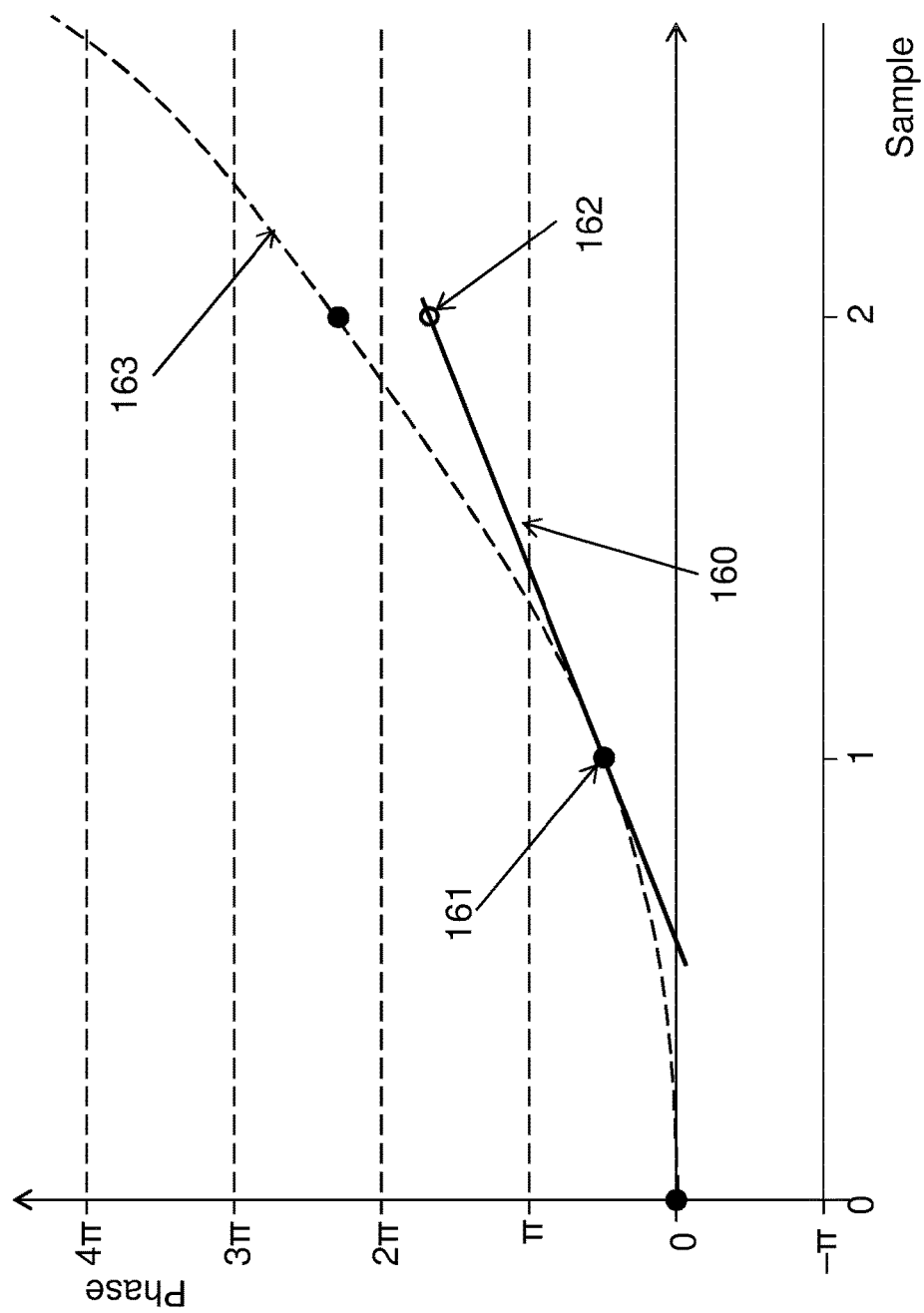
FIG. 16 shows a chart displaying extrapolation techniques.

FIG. 15 shows a further system for measuring the instantaneous frequency and recovering the phase information. The system generates a set of complex samples for each pulse as before. For each pulse, the instantaneous frequency is estimated in 144 as before. In 145 the instantaneous phase of each sample is calculated and the average of all samples within the pulse taken. The phase unwrap block 146 utilises an estimate of the actual phase from the previous phase and frequency measurement to unwrap the actual total phase change, as shown in FIG. 16. From sample 1 the instantaneous frequency (160) and phase (161) is calculated and used to extrapolate the phase (162) to the nearest $\pi$ radians, using $$\Delta\phi = -2\pi F_i T_s$$

where $\Delta\phi$ is the phase change between samples, $F_i$ is the instantaneous frequency and $T_s$ is the optical sample period. The estimated phase change is used to determine the number of $2\pi$'s that have been traversed between samples and thus unwrap the phase obtained in sample 2 to calculate the actual phase 163.

There are other ways in which the measure of instantaneous frequency may be utilised in order to extend the allowable dynamic range. For example in WO2008/110780 incorporated herein in its entirety, there is a method disclosed in which measurements of the instantaneous frequency are combined with the measured phase by stitching together segments in the time domain. A determination is made to see over what time periods the phase measurement is 'overscaled' (i.e. aliased). During periods of time in which the phase measurement is 'overscaled', an integrated version of the instantaneous frequency is substituted. In this way a signal is produced which is not overscaled, but has good signal to noise ratio.

Figure 17:
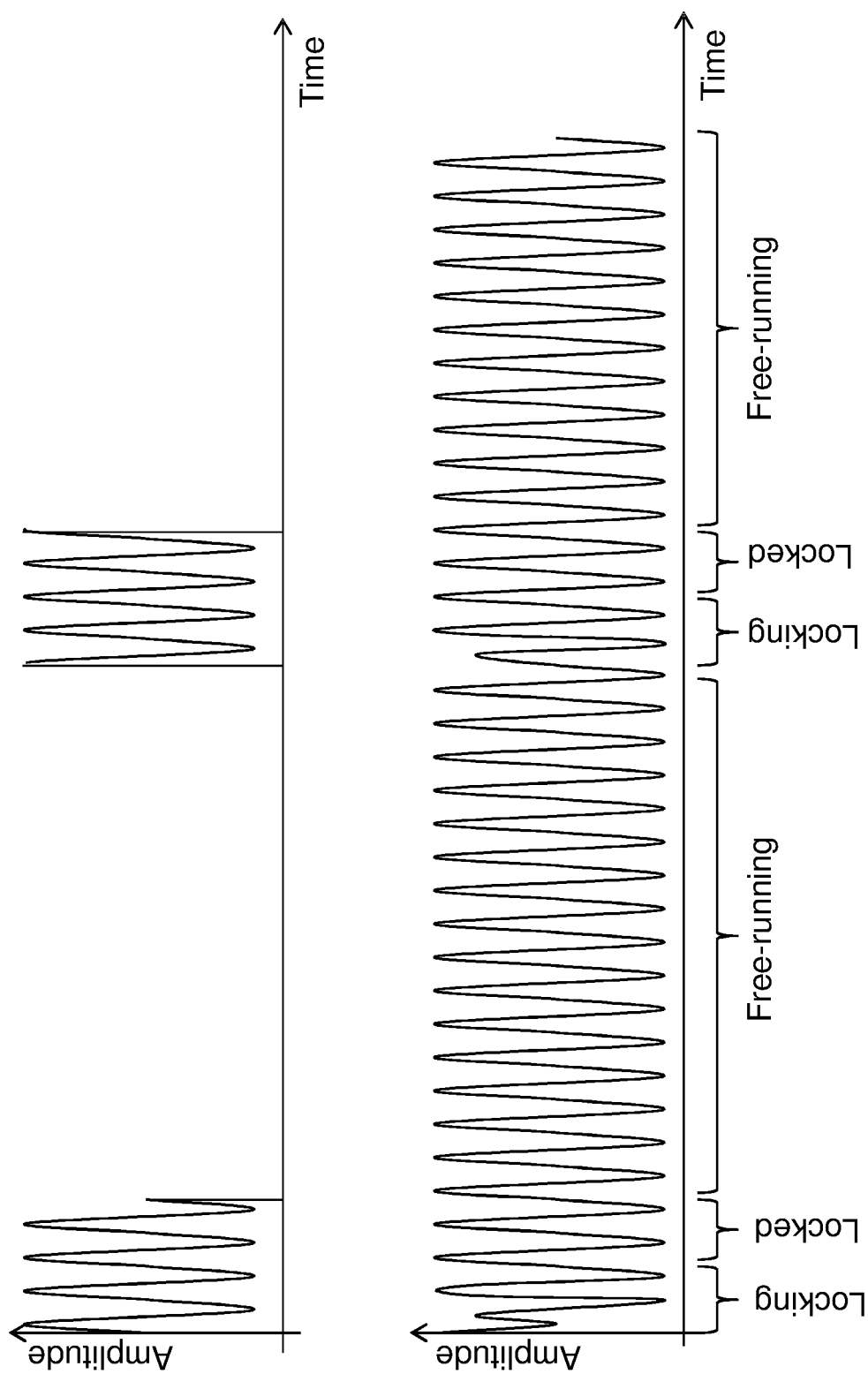
FIG. 17 shows a chart displaying PLL behaviour.

A Phase-Locked Loop (PLL) system is an alternative method which may be utilised to recover the signal. A PLL may be used which can lock to the sinusoidal signal which is detected within each pulse. The PLL must be capable of acquiring and locking to the received signal within the pulse width. In between pulses the PLL 'free-runs' at the same frequency at which it locked to. When it reaches the next pulse, it re-locks to the sinusoidal signal within that pulse. During the 'free-run' period, the PLL is effectively tracking through multiple $2\pi$ phase changes. Simulation has shown that a PLL is capable of locking to a signal within 2 cycles. This requires that $F_c$ is higher than in previous examples such that there are sufficient cycles of the carrier within each pulse for the PLL to acquire and lock to the signal. Simulation, as shown in FIG. 17 has demonstrated that a PLL can acquire lock within 2 cycles. A further 2 cycles within a pulse for the PLL to remain locked improves performance. Based on the previously discussed pulse width of 200 ns, this suggests an $F_c$ of 20 MHz. Utilising a high speed sampling rate of 200 MHz, and a pulse repetition frequency of 200 kHz simulations show that a PLL with a natural frequency $f_n$ of 8 MHz and damping factor $\zeta=0.9$ will settle within 20 samples. The phase output of the PLL can be used as a direct measurement of phase, or the frequency can be integrated to provide the measurement.

Figure 18:
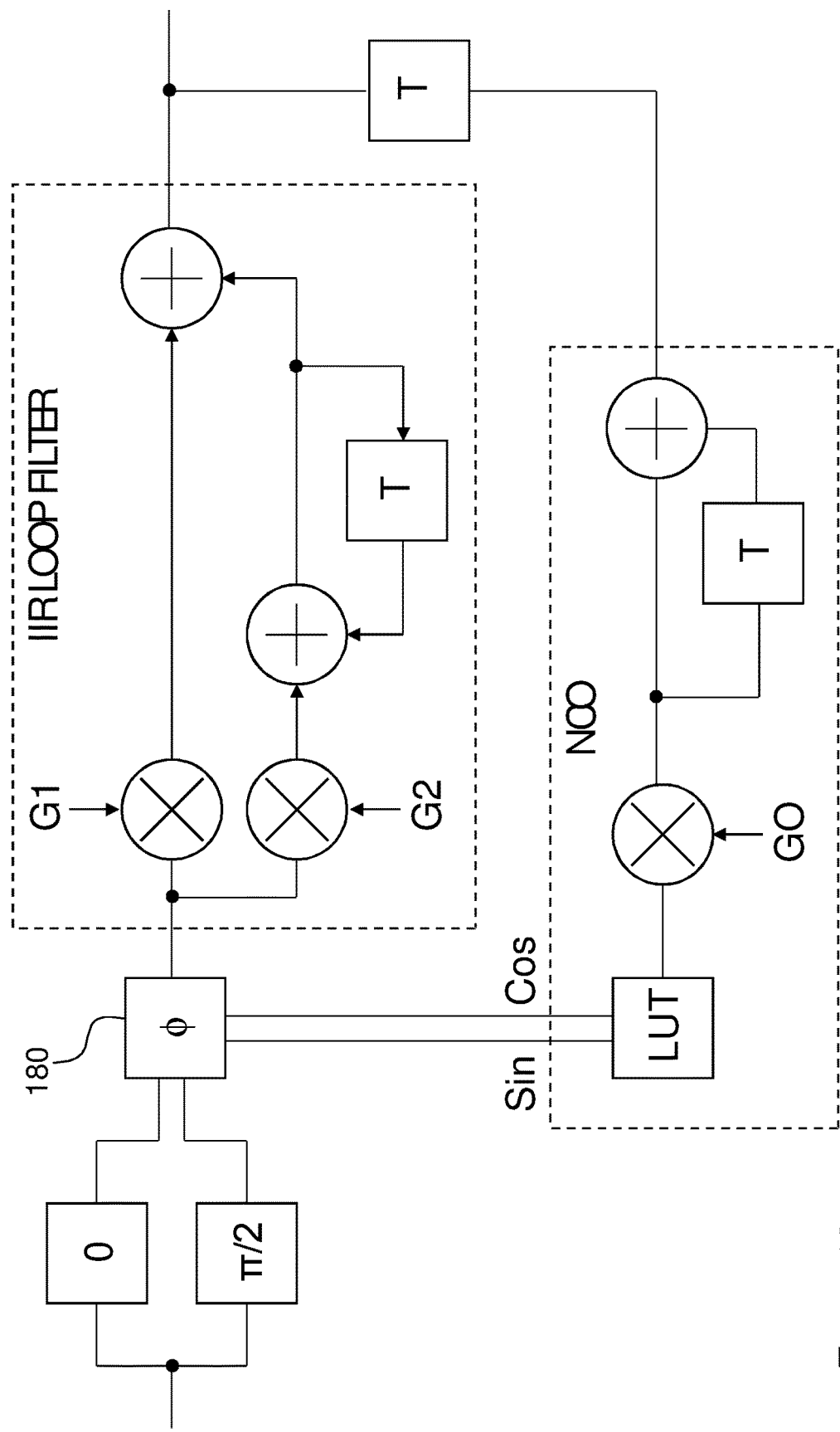
FIG. 18 shows a PLL system.

FIG. 18 shows a schematic diagram of a PLL that may be utilised in this system. The exemplary PLL utilises a Hilbert phase detector 180 which can provide an instantaneous phase error without subsequent filtering (which would cause time delay) to provide a very fast lock time. The PLL of FIG. 18 is given for example only and any PLL with appropriate characteristics can be utilised.

The above description has been given with respect to a particular sensor system and interrogation method. However, as will be appreciated the processing and analysis techniques are applicable to any sensor system or interrogation method in which a phase modulated signal must be demodulated to recover sensor data. In particular, the systems and methods described herein are not restricted to optical sensing systems.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of interrogating an optical sensing system performed at an interrogation system, comprising the steps of:
receiving a plurality of bursts of samples of an optical signal, each burst of samples comprising a plurality of samples of each pulse in a group of discrete optical pulses, wherein the groups are regularly spaced in time with a group repetition period larger than the group width, and the optical pulses comprise a phase modulated signal;
processing the bursts of samples to obtain a series of regularly spaced samples wherein processing the bursts of samples comprises processing the samples utilising a filter bank, the filter bank comprising a number of parallel paths equal to the number of samples in each burst; and
demodulating the regularly spaced samples to retrieve the phase information from the detected pulses.

2. A method according to claim 1, wherein each group of pulses consists of a single pulse.

3. A method according to claim 1, wherein each burst of samples comprises 8 to 80 samples.

4. A method according to claim 1, wherein the samples within each burst are at a sampling frequency of 40 to 400 MHz.

5. A method according to claim 1, wherein the group width is 200 ns.

6. A method according to claim 1, wherein the group repetition period is in the range of 0.5 μs to 10 μs.

7. A method according to claim 1, wherein the regularly spaced samples have a sample rate in the range of 10 MHz to 20 MHz.

8. A method according to claim 1, further comprising the steps of detecting the optical pulses, sampling the pulses to obtain the bursts of samples, and transmitting the bursts of samples to the interrogation system.

9. A method according to claim 8, wherein the steps of detecting, sampling, and transmitting are performed at a different location to the other steps of the method.

10. A method according to claim 8, wherein the optical pulses are returning from an optical sensor.

11. A method according to claim 8, further comprising the step of detecting other optical pulses returning from other optical sensors, wherein the optical pulses returning from different sensors are time multiplexed.

12. A method according to claim 1, wherein the phase change between adjacent samples of the regularly spaced samples is less than $\pi$.

13. An interrogation system configured to perform the methods of claim 1.

14. A method of interrogating an optical sensing system performed at an interrogation system, comprising the steps of:
receiving a plurality of bursts of samples of an optical signal, each burst of samples comprising a plurality of samples of each pulse in a group of discrete optical pulses, wherein the groups are regularly spaced in time with a group repetition period larger than the group width, and the optical pulses comprise a phase modulated signal;
processing the bursts of samples to obtain a series of regularly spaced samples; and
demodulating the regularly spaced samples to retrieve the phase information from the detected pulses, wherein the step of processing comprises the steps of downsampling the received samples, upsampling the downsampled samples, filtering the upsampled samples, and combining the filtered samples, and wherein the downsampling ratio is equal to the sample rate in each burst divided by the group repetition frequency.

15. A method according to claim 14, wherein the upsampling is performed at a rate of the group width multiplied by the sample rate in each burst.

16. A method according to claim 14, further comprising the steps of detecting the optical pulses, sampling the pulses to obtain the bursts of samples, and transmitting the bursts of samples to the interrogation system.

17. An interrogation system configured to perform the methods of claim 14.

18. A method of interrogating an optical sensing system performed at an interrogation system, comprising the steps of:
receiving a plurality of bursts of samples of an optical signal, each burst of samples comprising a plurality of samples of each pulse in a group of discrete optical pulses, wherein the groups are regularly spaced in time with a group repetition period larger than the group width, and the optical pulses comprise a phase modulated signal;
processing the bursts of samples to obtain a series of regularly spaced samples; and
demodulating the regularly spaced samples to retrieve the phase information from the detected pulses, wherein the step of processing comprises the steps of downsampling the received samples, upsampling the downsampled samples, filtering the upsampled samples, and combining the filtered samples, and wherein the upsampling is performed at a rate of the group width multiplied by the sample rate in each burst.

19. A method according to claim 18, further comprising the steps of detecting the optical pulses, sampling the pulses to obtain the bursts of samples, and transmitting the bursts of samples to the interrogation system.

20. An interrogation system configured to perform the methods of claim 18.

* * * * *